United States Patent [19]

Capek et al.

[11] 4,078,284
[45] Mar. 14, 1978

[54] PIEZOELECTRIC SUBSTRATE FABRICATION PROCESS

[75] Inventors: Raymond G. Capek, Elmhurst; Ann A. Koss, Elmwood Park; Frank T. Takahashi, Chicago, all of Ill.

[73] Assignee: Zenith Radio Corporation, Glenview, Ill.

[21] Appl. No.: 784,293

[22] Filed: Apr. 4, 1977

[51] Int. Cl.$^2$ ............................................. H01L 41/22
[52] U.S. Cl. .................... 29/25.35; 252/62.9
[58] Field of Search .................. 29/25.35; 252/62.9 R, 252/62.9 PZ; 310/313

[56] References Cited

U.S. PATENT DOCUMENTS

| | | | |
|---|---|---|---|
| 3,642,637 | 2/1972 | Ikegami et al. | 252/62.9 R |
| 3,917,780 | 11/1975 | Mazdiyasni et al. | 252/62.9 PZ |

OTHER PUBLICATIONS

"Effects of Additives in Piezoelectric and Related Properties of PbTiO$_3$ Ceramics", Japanese Journal of Applied Physics, vol. 11, No. 4, Apr. 1972, p. 450, Ueda.
"Electromechanical Properties of PbTiO$_3$ Ceramics", The Journal of the Acoustical Society of America, vol. 50, No. 4, (part 1), p. 1060, Ueda et al.

*Primary Examiner*—Carl E. Hall
*Attorney, Agent, or Firm*—Nicholas A. Camasto; Roy A. Ekstrand

[57] ABSTRACT

A method of fabricating a lead titanate piezoelectric surface acoustic wave substrate comprises combining lead oxide, titanium tetra-n-butoxide, lanthanum oxide, and manganese dioxide, with a hydrocarbon solvent and adding water to the combination to form a slurry in which titanium polyester is precipitated unto the lead oxide and lanthanum and manganese oxides. The slurry is dried by heating to a temperature sufficient to remove the liquids therefrom but below the temperature at which an exothermic reaction between the included hydrogen, oxygen and carbon occurs. A first calcining operation produces the exothermic reaction and forms lead titanate after which the lead titanate is heated to and maintained at a temperature above that produced by the exothermic reaction. The lead titanate is then ground to produce powdered lead titanate and a second calcining is carried out to produce structural annealing of the powdered lead titantate. Binder materials are added and the combination of powdered lead titanate and binder materials is cold-pressed into substantially planar substrates. After removal of the binders by heating, the substrates are fired to reduce porosity and poled to impart a piezoelectric characteristic.

12 Claims, 2 Drawing Figures

PIEZOELECTRIC SUBSTRATE FABRICATION PROCESS

BACKGROUND OF THE INVENTION

This invention relates generally to surface acoustic wave devices and particularly to the wave propagating substrates used therein. Basically, surface acoustic wave devices are comprised of a substrate medium having at least one surface ground and polished to mirror-like finish upon which one or more transducer patterns are formed. In the case of piezoelectric devices to which the present invention relates, the medium is a piezoelectric material and the transducer patterns generally take the form of comb-like metallic structures having interleaved finger pairs. A voltage applied between the "combs" of the launching transducer causes an interelectrode voltage between finger pairs within the transducer which in turn deforms or stresses the piezoelectric medium. In most applications, the voltage applied is a time varying voltage and the successive voltage variations produce varying stresses of the substrate medium causing the propagation of acoustic waves across the surface. In most applications, a second receiving transducer having a structure similar to that of the launching transducer is illuminated by the propagating waves. The mechanical energy of the impinging surface waves is reconverted back to electrical energy in the form of voltage between the comb sections.

In the great majority of surface acoustic wave device applications, the transducer structure is periodic and therefore exhibits a predetermined frequency characteristic in which a band of frequencies (close to the synchronous frequency) causes a maximum interaction with the medium surface while those outside the band cause a minimum reaction. The synchronous frequency for any given combination of substrate material and transducer arrangement is determined largely by the relationship between spacing of the transducer comb elements and surface wave velocity of the piezoelectric medium. As a result, consistency of frequency response of mass produced surface acoustic wave devices requires that the surface wave velocity of successive substrates remain within a narrow range of acceptable tolerance. In addition, the most commonly used method of forming transducer structures on the substrate surface involves initially depositing a uniform metallic film across the entire surface and photo-etching to remove undesired metal and produce a transducer pattern. As a result, a substantially uniform fine-grain structure in the material is needed for proper transducer formation.

Piezoelectric surface acoustic wave devices have been commercially manufactured using either lithium niobate or lead zirconate titanate (generally abbreviated PZT) materials. The former is a single-crystal medium so-called because it is fabricated from a single large elongated crystal formed by conventional crystal growth processes. The elongated crystal is "poled" by application of an appropriate DC electric field to impart a piezoelectric characteristic to the material. The poled elongated crystal is then crystallographically aligned and sliced into a number of substantially planar disks. The disks are then ground and polished by successively finer abrasives until a mirror-like surface is obtained upon which a plurality of identical transducer patterns (typically 40 or so) are photo-etched. Finally, the disks are scored between the individual transducer patterns permitting separation of individual surface acoustic wave devices.

PZT is a polycrystalline material so-described because the constituent components of lead, zirconium and titanium in the form of metal oxide powders are essentially ground to a fine powder which is blended to form a homogeneous mixture. A "hot pressing" technique in which high temperatures and pressures are simultaneously imposed upon the mixture causes the materials to react and form an elongated "boule" of PZT. The boule is then processed in a manner similar to the elongated crystal of lithium niobate, that is, the boule is poled to impose piezoelectric properties, sliced to form a plurality of planar disks, and subjected to successive grinding and polishing operations to produce a smooth surface upon which a plurality of transducer structures are formed.

Acceptable commercial results of device consistency have been achieved with both single crystal lithium niobate and polycrystalline PZT. However, the fabrication costs associated with such substrates has resulted in generally prohibitive surface acoustic wave device costs making their infusion into consumer electronic applications slow despite their substantial performance advantages.

Another polycrystalline material, lead titanate exhibits considerable promise as an acoustic surface wave medium. It is in some sense similar to PZT but enjoys economic advantages over both lithium niobate and PZT. In addition, lead titanate has a more favorable ratio of thickness coupling to radial coupling than PZT which simply stated, means that a greater portion of the electrical energy imparted to the transducer is converted into surface acoustic waves rather than undesired bulk mode waves. Also the Curie temperature of lead titanate is higher than PZT which means essentially that the piezoelectric properties, once imparted to lead titanate, remain unaffected when the substrate is subjected to higher temperature processing and operating environments. And finally, lead titanate has a low dielectric constant and a high mechanical "Q" making it well suited to high frequency signal operations.

Conventional titanium oxide processes and ceramic "air fired" methods have been used to manufacture lead titanate suitable for use in bulk mode piezoelectric resonators. Examples of these "oxide" processes are found in U.S. Pat. No. 3,642,637 entitled "Piezoelectric Ceramic Composition" issued Feb. 15, 1972 and in scientific publications such as "Effects of Additives in Piezoelectric and Related Properties of PbTiO$_3$ Ceramics", Japanese Journal of Applied Physics, Vol. 11, No. 4, April 1972, p. 450, and "Electromechanical Properties of PbTiO$_3$ Ceramics", The Journal of the Acoustical Society of America, Vol. 50, No. 4 (Part 1), p. 1060.

Application of lead titanate as a medium for surface acoustic wave devices, however, has thus far been subject to a substantial disadvantage which has limited its commercial success. This limitation arises due to the difficulties associated with fabricating lead titanate substrates which are mechanically stable and have the sufficiently uniform fine-grain structure required to produce the uniform surface wave velocities so essential to mass production. Some success has been realized by the utilization of hot pressing techniques similar to those associated with PZT together with lanthanum dopants, however, such hot press fabrication is subject to the same economic disadvantages associated with formation of PZT.

Accordingly, it is an object of the present invention to provide an improved method of fabricating a lead titanate surface acoustic wave substrate. It is a further object of the present invention to provide an economical cost-effective method for producing fine grain lead titanate surface acoustic wave substrates having acceptable consistency of properties.

SUMMARY OF THE INVENTION

A method of fabricating a lead titanate piezoelectric acoustic wave substrate comprises the steps of combining an inorganic lead compound, a titanium alkoxide, a lanthanide series or thorium metal compound, a compound formed of a metal selected from vanadium, manganese, niobium and tantalum, and a hydrocarbon solvent to which water is added to form a slurry in which titanium polyester is precipitated unto the lead and the other metal compounds. The slurry is dried by heating to a temperature sufficient to remove the liquids therefrom but below the self-calcining temperature of the dried slurry. A first calcining step is carried out to produce lead titanate which is ground to produce powdered lead titanate. A second calcining step is then carried out to produce structural annealing of the lead titanate powder whereupon binder materials are added and the combination of powdered lead titanate and binder materials are cold pressed into substantially planar substrates. The binders are removed by heating the substrates after which they are air fired to reduce porosity. The lead titanate substrates are then poled to impart piezoelectric characteristics.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

DESCRIPTION OF THE PREFERRED EMBODIMENT

Figure 1:
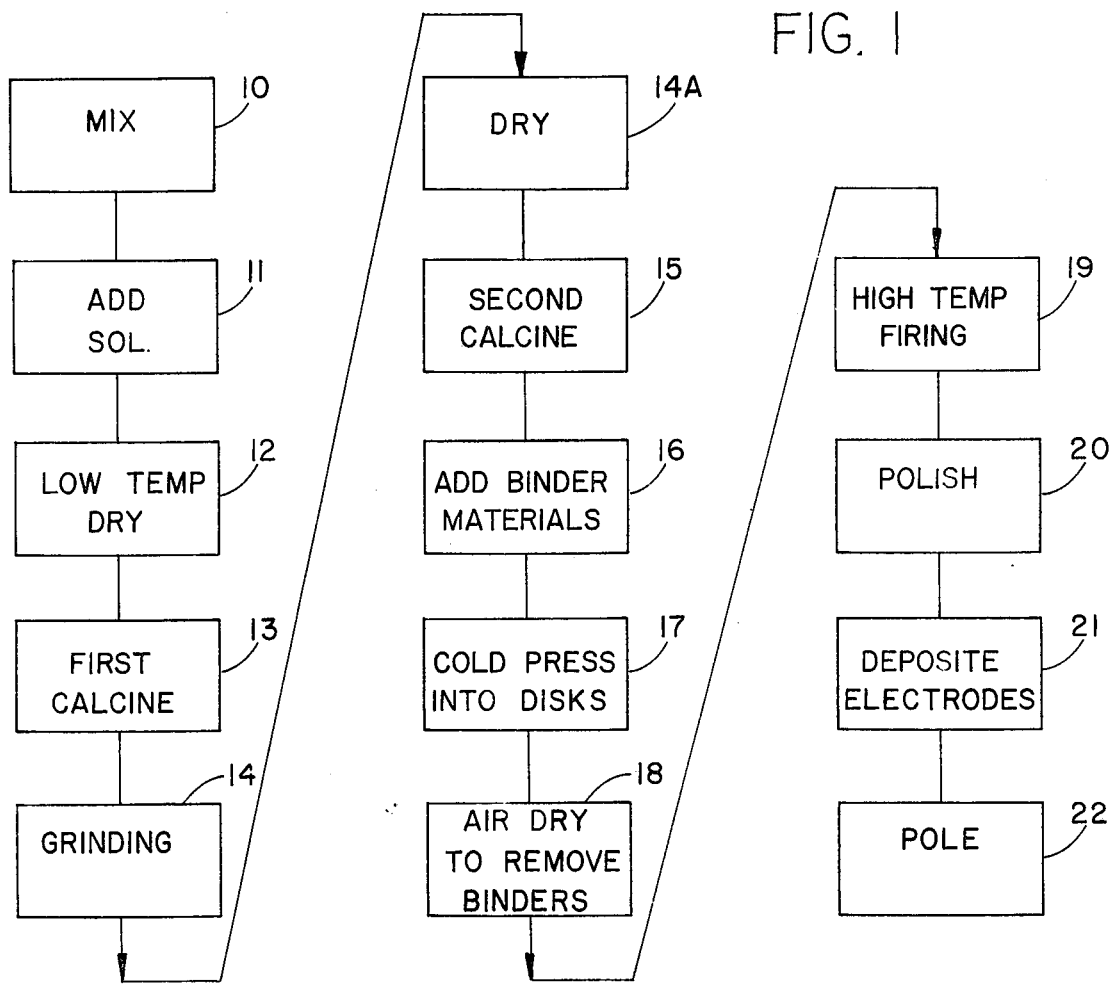
FIG. 1 is a flow diagram of a process in accordance with the present invention method.

FIG. 1 shows a flow diagram for a method of fabrication in accordance with the present invention. A mixing step 10 is performed in which the constituent components of titanium tetra-n-butoxide liquid, lead oxide, manganese dioxide, and lanthium oxide are combined to form a slurry. The amounts of each constituent may in some cases be varied, however, the following relative amounts (shown in Table I) used to produce a 200 gram "batch" are found to provide excellent results. The titanium alkoxide (tetra-n-butoxide) and lead oxide provide the constituent titanium and lead for the eventual lead titanate ceramic. However, the lanthanum oxide is added in accordance with known principles to inhibit grain growth in the lead titanate thereby helping to insure a finer grain structure. Similarly, manganese dioxide is added to increase the resistivity of the lead titanate in accordance with principles well known in the art. For clarity, the amounts given for other ingredients in subsequent process steps which will also correspond to this 200 gram batch. It has been noted that care in using a "pure" lead oxide improves consistency of results. Several commercially available lead oxides have required heating at 600° C for 4 hours and cooling in desiccator (i.e., dry chamber) to assure this purity.

Table I

| Titanium tetra-n-butoxide | 200 cc |
|---|---|
| Lead oxide | 145.06 gm |
| Lanthanum oxide | 2.172 gm |
| Manganese dioxide | 0.583 gm |

A hydrolysis step 11 in which 300cc of a 66% solution of isopropyl alcohol and deionized water is added slowly, is then performed causing the formation of titanium polyester by the following reaction:

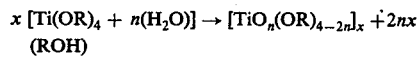

in which R is alkyl radical, $n$ is ratio of water to alkoxide used in the reaction and $x$ is total amount of the alkoxide and water involved in hydrolysis. The isopropyl alcohol used in the hydrolysis does not enter into the reaction but is used to extend the suspension which becomes very viscous upon hydrolysis. The titanium polyester is precipitated onto the lead and metal oxide held in suspension within the hydrolyzed slurry. For reasons described in greater detail below, the precipitation of titanium polyester upon the lead and metal oxide grains held in suspension provides an extremely uniform mixture of titanium compounds and lead. The hydrolyzed solution is then subjected to a low temperature drying step 12 in which the slurry is heated in open air to remove liquid. Because the constituent components of the slurry include reactable hydrocarbons and sources of available oxygen, a potential for exothermic reaction between the hydrogen, carbon and oxygen exists when the slurry temperature is elevated above 60° C. In many prior art processes, this exothermic reaction is intentionally triggered during the drying step to produce sufficient heat to raise the lead and titanium compounds to the reacting temperature and form lead titanate. For this reason, the temperature at which the exothermic reaction is triggered (i.e., 60° C in this case), is often referred to as the "self-calcine" temperature. However, in the low temperature drying step of the present invention method, the material is maintained below the self-calcining temperature to avoid triggering the exothermic reaction because it has been found that allowing the material to react in such a manner produces a lead titanate having an undesired crystal structure. Further, it has been determined that this undesired structure, once allowed to form, remains despite successive grinding and calcining operations.

Figure 2:
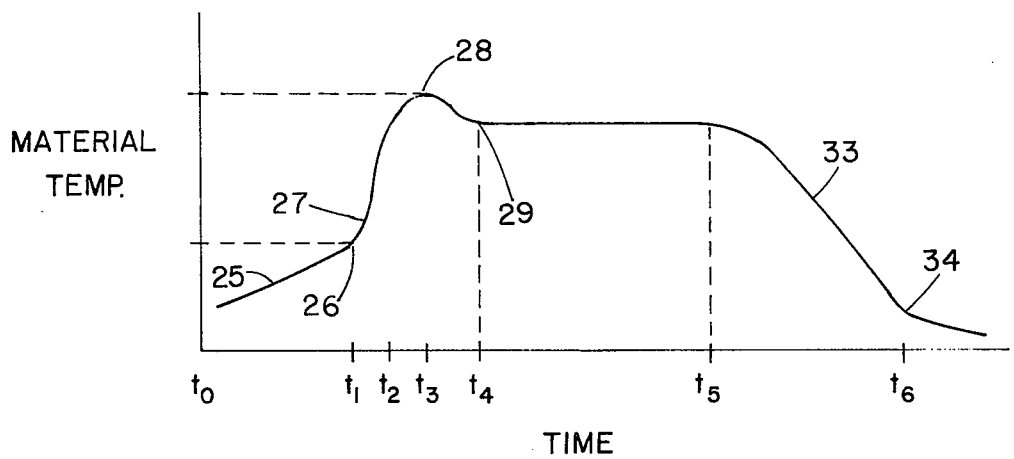
FIG. 2 is a detailed time versus temperature plot of the first calcining step of FIG. 1.

Once the material has been dried with careful avoidance of self-calcining, a controlled first calcining step 13 is performed. The nature of this first calcine step is best understood by reference to FIG. 2 which shows a plot of material temperature (on the vertical axis) versus time (displayed on the horizontal axis). Calcining step 13 is a substantially continuous temperature cycle which is best understood if considered to be composed of 5 segments or intervals. The first interval from time $t_0$ to $t_1$ comprises the endothermic process of raising the material temperature along slope 25 to the 60° C point 26 at which the above-described exothermic reaction begins. During the second interval, the combination of heat produced by the exothermic reaction and continued oven heating raises the material temperature rather sharply along slope 27. At one point in the temperature increase (time $t_2$), the material reaches a sufficient temperature to cause the lead and titanium precipitate thereon to react forming lead titanate by the following equation:

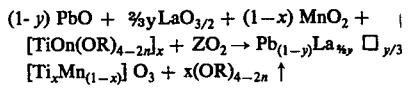

$$(1-y)\, PbO + \tfrac{2}{3}y LaO_{3/2} + (1-x)\, MnO_2 + $$
$$[TiOn(OR)_{4-2n}]_x + ZO_2 \rightarrow Pb_{(1-y)}La_{\tfrac{2}{3}y}\,\square_{y/3}$$
$$[Ti_xMn_{(1-x)}]O_3 + x(OR)_{4-2n} \uparrow$$

in which $y$ is the amount of lead ion deleted from stoichiometric lead titanate, $\tfrac{2}{3}y$ is the amount of lanthanum ion, $x$ is the amount of titanium ion, $1-x$ is the amount of manganese ion and $z$ is the atmosphere contributed oxygen required in the pyrolysis of the titanium polyester. The valance difference between lead and lanthanum dictate this imbalance in order to maintain electrical neutrality. The exothermic reaction and increase of oven temperature continue until time $t_3$ (approximately 750°), when the exothermic reaction has been substantially depleted and the lead titanate has been formed. With the termination of the exothermic reaction, the lead titanate cools along slope 28 for a third interval ($t_3$ to $t_4$) until the material temperature coincides with that of the oven (to point 29) and the process again becomes endothermic terminating the second interval. At this point, all the lead titanate has been formed. However, it has been found that an improved polycrystalline structure in the final product is achieved if the lead titanate is maintained for a fourth interval ($t_4$ to $t_5$) at a temperature of approximately 600° C. The final, or fifth, interval of the first calcining cycle is completed by a final cool down interval ($t_5$ to $t_6$) during which time the material temperature is reduced at a predetermined rate to room temperature.

Following first calcining step 13, the lead titanate in the form of a powder is combined with deionized water to form a second slurry which is subjected to a grinding step 14 in a grinding mill having zirconia grinding mortars. It will, of course, be apparent to those skilled in the art that any non-contaminating grinding mill can be used. Grinding step 14 reduces the agglomerates in the lead titanate compound to less than 1 micron and further homogenizes the material afterwhich a drying step 14A is carried out. A second calcine step 15 follows drying step 14A in which the ground lead titanate is heated in free air to 800° C. This second calcining enhances the structure of the lead titanate by annealing the material and relieving stresses imparted during the grinding step and insures a complete calcining of the material.

The calcined lead titanate powder, once annealed, is combined with appropriate binder materials in step 16. Although any number of appropriate binder materials may be used at this point with effective results, excellent results have been obtained using the combination of glycerin and a 28% polyvinyl alcohol solution, together with Darvan C wetting agent in the amounts shown in Table II.

Table II

| | |
|---|---|
| PbTiO$_3$ | 89.3 wt.% |
| Glycerin | 0.7 wt.% |
| Alcohol solution (28%) | 8.4 wt.% |
| Darvan C | 1.6 wt.% |

The function of the binder materials is to provide a workable consistency for use in cold press step 17. Accordingly, the material is placed in a forming die (approximately 2 inches in diameter) and a pressure of 57,000 pounds per square inch (psi) is applied forming planar disks of cold pressed lead titanate of approximately 0.030 inch to 0.050 inch thickness. The pressed disks are then air baked in step 18 at 600° C for approximately 4½ hours in free air to remove the binder materials.

After binder "burn-out" in step 18, the cold-pressed lead titanate disks, which are at this point extremely fragile and porous, are "densified" in firing step 19 by heating for approximately one hour in a high temperature oven at 2000° F while enclosed within alumina crucibles. As is well-known in the ceramic arts, high temperature "firing" or "sintering" causes a reduction of boundary voids or spaces between the ceramic grains and a corresponding shrinkage of the disk. Once firing step 19 is complete, a lead titanate substrate which is mechanically stable and of extremely uniform fine grain structure and low porosity has been formed which is suitable for use as a surface acoustic wave medium.

At this point, it remains only to impart piezoelectric properties to the disk and polish the eventual wave propagating surface in order to form the final piezoelectric lead titanate substrate. While it is optional to pole the material before or after polishing and deposition of the metal film required for photo-etching transducer structures, it has been found to be more economical to polish the fired disks before poling. This allows the metallized film deposited during the transducer pattern photo-etching process to be used as a poling electrode thereby realizing a savings of both material and cost.

Accordingly, in the preferred method and fired disks produced at the conclusion of step 19 are subjected to a polishing step 20 in which the planar surfaces are lapped to parallelity and one of them is polished by successively finer abrasives until a mirror-like smoothness is obtained. Following this polishing operation, an extremely thin metal film (typically 6000A aluminum) is deposited in step 21 upon the two surfaces by conventional techniques. Following this "electroding", a DC poling field of 200 volts per mil is applied for 30 minutes in step 21 while the substrates are immersed in a 200° C oil bath. The fired substrate is, of course, many times larger than the eventual surface acoustic wave device which is formed from the substrate. In accordance with the above-described mass production processes, multiple transducer patterns are simultaneously etched onto each disk. The disk is then scored and separated between the patterns to produce a number of devices from each substrate.

It will be apparent to those skilled in the art that a number of substitutions for the described ingredients may be made during many of the process steps of the present inventive method without departing from the spirit and scope of the present invention. For example in mixing step 10, virtually any inorganic lead compound may be used in place of lead oxide. Similarly, any number of titanium alkoxides may be substituted for titanium tetra-n-butoxide. Also, vanadium, niobium and tantalum metal compounds may be used in place of manganese dioxide. In particular, vanadium has been tested and achieved excellent results. In addition, metal compounds in the lanthanide series and thorium may be used in place of lanthanum oxide. Thorium has also been tested and has proven to be an excellent substitute for lanthanum. Finally, virtually any hydrocarbon solvent may be effectively substituted for isopropyl alcohol. In the same vein, the binder materials used in steps 16 and 17 may be varied using any volatile binder material which can be subsequently "burned off".

It will be equally apparent to those skilled in the art that the present invention process has substantial economic advantage over prior art hot-press methods of fabricating lead titanate surface acoustic wave device substrates. The present invention process allows use of the more economical high volume process of oven or kiln firing many individual disks simultaneously while the use of hot pressing techniques requires great numbers of expensive facilities not suited to high production rates and expensive slicing machinery to support a high volume operation. As a result, the present invention process permits the use of lower cost bulk-mode device production methods to produce lead titanate fulfilling the extremely demanding requirements of surface acoustic wave devices.

Table III shows the characteristics of lead titanate substrates produced in accordance with the present invention process.

Table III

| | |
|---|---|
| Thickness coupling | .44 |
| Radial coupling | .08 |
| Mechanical "Q" | 1260 |
| Resistivity (ohm-cm) | $3 \times 10^{12}$ |
| Tan δ | .01 |
| Dielectric constant | 195 |
| Density (gm/cc) | 7.65 |
| Diameter shrinkage (%) | 14.0 |
| Grain size (microns) | 0.8 |

What has been shown is a novel method of fabricating lead titanate substrates having suitable properties for use as surface acoustic wave device substrates.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

We claim:

1. A method of fabricating a lead titanate piezoelectric surface acoustic wave substrate comprising the steps of:
    combining an inorganic lead compound, a titanium alkoxide, a lanthanide series metal compound, and a compound formed of a metal selected from vanadium, manganese, niobium and tantalum;
    adding a hydrocarbon solvent and water to the combination formed in said combining step to form a slurry in which titanium polyester is precipitated unto said lead compound;
    drying said slurry by heating to a temperature sufficient to remove the liquid therefrom but below the self-calcining temperature of said slurry;
    first calcining the dried slurry to produce lead titanate;
    grinding said lead titanate to produce powdered lead titanate;
    second calcining said powdered lead titanate to produce structural annealing;
    adding binder materials;
    cold pressing the combination of said powdered lead titanate and said binder materials into substantially planar substrates;
    removing said binders by heating said substrates;
    firing said substrates to reduce porosity thereof; and
    poling said substrates to impart piezoelectric characteristic thereto.

2. The method set forth in claim 1 wherein the dried slurry produces an exothermic reaction of the included hydrogen, carbon, and oxygen at or above said self-calcining temperature and wherein said step of first calcining includes the steps of:
    initially heating said dried slurry to produce said exothermic reaction;
    reaction heating said dried slurry during said exothermic reaction such that the combined effect of said exothermic reaction and said reaction heating raises the temperature of said dried slurry to a reaction temperature at which said titanium polyester and said lead compound react to form lead titanate;
    final heating said lead titanate after the termination of said exothermic reaction to a predetermined elevated temperature to produce a substantially uniform crystal structure; and
    cooling said material at a predetermined rate.

3. The method set forth in claim 2 wherein said titanium alkoxide comprises titanium tetra-n-butoxide.

4. The method set forth in claim 3 wherein said metal compound formed of a metal selected from vanadium, manganese, niobium and tantalum comprises a manganese oxide.

5. The method set forth in claim 4 wherein said manganese oxide comprises manganese dioxide.

6. The method set forth in claim 3 wherein said inorganic lead compound comprises lead oxide.

7. The method set forth in claim 3 wherein said lanthanide series metal comprises lanthanum.

8. The method set forth in claim 7 wherein said rare-earth compound comprises lanthanum oxide.

9. The method set forth in claim 3 wherein said hydrocarbon solvent comprises an alcohol solution.

10. The method set forth in claim 9 wherein said alcohol solution includes isopropyl alcohol.

11. A method of fabricating a lead titanate piezoelectric surface acoustic wave substrate comprising the steps of:
    combining an inorganic lead compound, a titanium alkoxide, a thorium metal compound, and a compound formed of a metal selected from vanadium, manganese, niobium and tantalum;
    adding a hydrocarbon solvent and water to the combination formed in said combining step to form a slurry in which titanium polyester is precipitated unto said lead compound;
    drying said slurry by heating to a temperature sufficient to remove the liquid therefrom but below the self-calcining temperature of said slurry;
    first calcining said dried slurry to produce lead titanate;
    grinding said lead titanate to produce powdered lead titanate;
    second calcining said powdered lead titanate to produce structural annealing;
    adding binder materials;
    cold pressing the combination of said powdered lead titanate and said binder materials into substantially planar substrates;
    removing said binders by heating said substrates;
    firing said substrates to reduce porosity thereof; and
    poling said substrates to impart piezoelectric characteristic thereto.

12. A method of fabricating a lead titanate piezoelectric surface acoustic wave substrate comprising the steps of:

combining lead oxide, titanium tetra-n-butoxide, lanthanum oxide, and manganese dioxide;

adding a hydrocarbon solvent and water to the mixture formed in said combining step to form a slurry in which titanium polyester is precipitated unto said lead oxide;

drying said slurry by heating to a temperature sufficient to remove the liquid therefrom but below the temperature at which an exothermic reaction occurs between the hydrogen, oxygen and carbon within the constituents of said slurry;

first calcining said slurry to produce said exothermic reaction and form lead titanate;

heating said lead titanate at a predetermined temperature to insure proper crystal structure;

grinding said lead titanate to produce powdered lead titanate;

second calcining said powdered lead titanate to produce structural annealing thereof;

adding binder materials;

cold pressing the combination of said powdered lead titanate and said binder materials into substantially planar substrates;

removing said binders by heating said substrates;

firing said substrates to reduce porosity thereof; and poling said substrates to impart piezoelectric characteristic thereto.

* * * * *